(12) United States Patent
Karandikar et al.

(10) Patent No.: US 9,996,101 B2
(45) Date of Patent: Jun. 12, 2018

(54) IDENTIFICATION OF A POWER SOURCE IN A MULTIPLE POWER SOURCE SCENARIO AND CHARACTERIZATION OF LOADS

(71) Applicant: Indian Institute of Technology Bombay, Mumbai (IN)

(72) Inventors: Abhay Karandikar, Mumbai (IN); Rushabh B Shah, Mumbai (IN); Jaspreet Singh, Safidon (IN)

(73) Assignee: INDIAN INSTITUTE OF TECHNOLOGY BOMBAY, Mumbai (IN)

( * ) Notice: Subject to any disclaimer, the term of this patent is extended or adjusted under 35 U.S.C. 154(b) by 281 days.

(21) Appl. No.: 14/882,835

(22) Filed: Oct. 14, 2015

(65) Prior Publication Data

US 2016/0103164 A1  Apr. 14, 2016

(51) Int. Cl.
*G01R 31/40* (2014.01)
*G06F 1/00* (2006.01)

(52) U.S. Cl.
CPC .............. *G06F 1/00* (2013.01); *G01R 31/40* (2013.01)

(58) Field of Classification Search
USPC ........... 324/76.11, 76.39, 500, 509; 323/234, 323/299, 304, 318
See application file for complete search history.

(56) References Cited

U.S. PATENT DOCUMENTS

| | | | | |
|---|---|---|---|---|
| 2010/0191487 | A1* | 7/2010 | Rada | G05F 1/70 702/60 |
| 2011/0021186 | A1* | 1/2011 | Fischer | H01Q 1/246 455/424 |
| 2011/0195111 | A1* | 8/2011 | Butters | G01N 37/005 424/450 |
| 2013/0093324 | A1* | 4/2013 | Brown | B60Q 1/1407 315/77 |
| 2015/0035286 | A1* | 2/2015 | Stephens | B63H 21/22 290/4 A |

* cited by examiner

*Primary Examiner* — Vincent Q Nguyen
(74) *Attorney, Agent, or Firm* — Mannava & Kang, P.C.; Vinay Malik

(57) ABSTRACT

Identification of a power source in a multiple power source scenario and characterization of loads. Embodiments herein relate to loads being supplied by multiple power sources and more particularly to identifying the power source supplying power to the load. Embodiments herein disclose a method and system for determining a power source providing power to a load, wherein the load is connected to a plurality of power sources. Disclosed herein is a method and system for characterizing at least one load currently connected to at least one power supply.

24 Claims, 9 Drawing Sheets

IDENTIFICATION OF A POWER SOURCE IN A MULTIPLE POWER SOURCE SCENARIO AND CHARACTERIZATION OF LOADS

PRIORITY DETAILS

The present application is based on, and claims priority from, Indian Application Number 3282/MUM/2014, filed on 14 Oct. 2014, the disclosure of which is hereby incorporated by reference herein.

TECHNICAL FIELD

Embodiments herein relate to multiple power sources supplying power to at least one load and more particularly to identifying the power source supplying power to the load(s) and characterizing the load(s), in case of multiple power sources supplying power to the load and the possibility of multiple loads being present.

BACKGROUND

Various sources of power supplies can be connected to one or more loads (wherein each load can comprise of one or more equipment), wherein one or more than one of the connected power sources can be used to supply power to the load. For example, in case of a wireless communication Base Station (BS), the BS can be connected to multiple power supplies such as the electricity grid, a generator, solar panels, a battery (which is directly connected to a Direct Current (DC) power plant) using a suitable module such as Line Control Unit (LCU), Auto Mains Failure (AMF) and so on. From the module, the power is given to the Direct Current (DC) Power Plant and then the load (the BS, in this example) is connected. The energy costs for each source is different, hence a major challenge faced is identification of the power source used for evaluating energy costs.

The conventional way of determining which power supply is supplying power to the load is through the help of Sensors. The sensors are connected at each power source pre-accumulation (as depicted in FIG. 1).

However, the current technology is prone to tampering as the sensors connected to particular power supplies could be interchanged or tampered with and hence there is low reliability. Also, sensor hardware is an additional expense.

Similarly, the load connected to the power supplies can be characterized by use of sensors connected prior to the connection of the load. Here also, the current technology is prone to tampering as the sensors connected to particular loads could be interchanged or tampered with and hence there is low reliability. Also, sensor hardware is an additional expense.

BRIEF DESCRIPTION OF FIGURES

Embodiments herein are illustrated in the accompanying drawings, through out which like reference letters indicate corresponding parts in the various figures. The embodiments herein will be better understood from the following description with reference to the drawings, in which.

DETAILED DESCRIPTION

Figure 1:
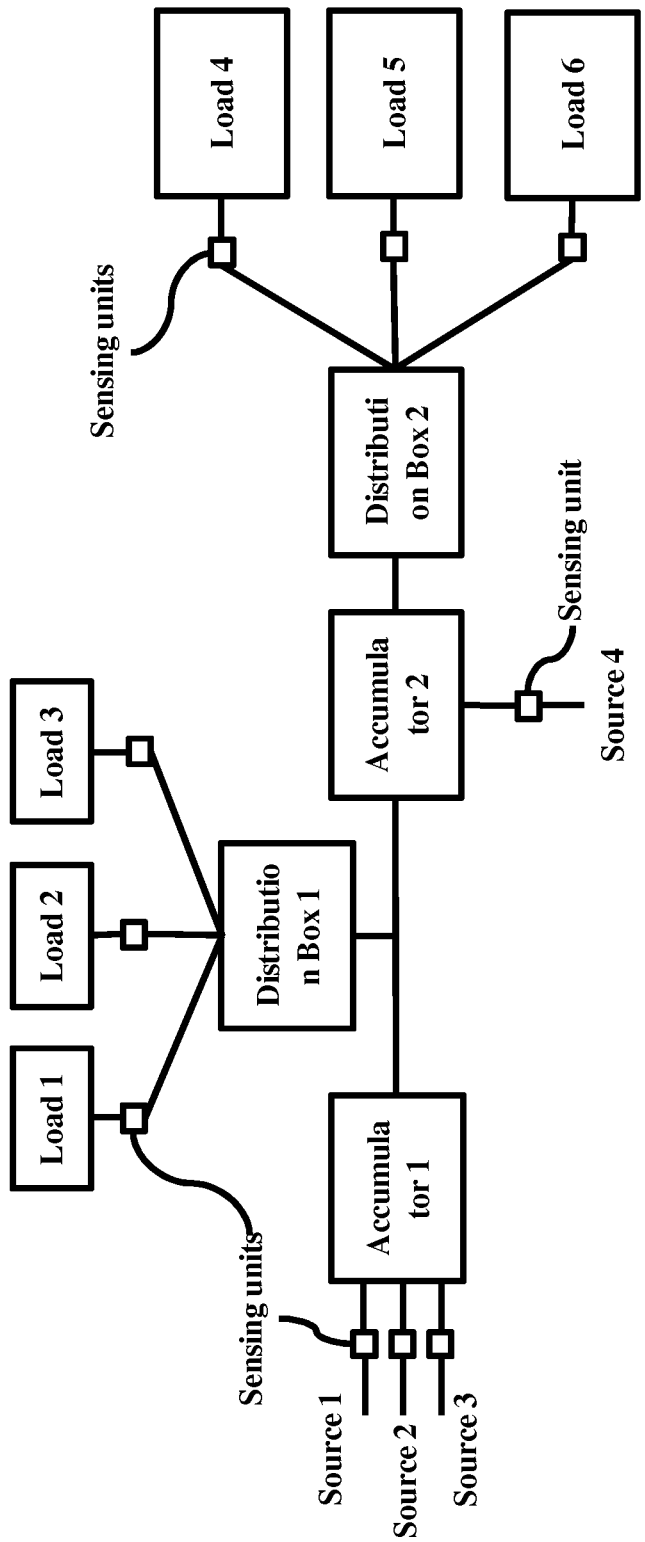
FIG. 1 depicts a conventional system for determining a power source by connecting sensors to each of the power sources.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein can be practiced and to further enable those of skill in the art to practice the embodiments herein. Accordingly, the examples should not be construed as limiting the scope of the embodiments herein.

The embodiments herein achieve a method and system for determining at least one power source currently providing power to a load, wherein the load is connected to a plurality of power sources. Referring now to the drawings, and more particularly to FIGS. 1 through 8, where similar reference characters denote corresponding features consistently throughout the figures, there are shown preferred embodiments.

Embodiments herein disclose a method and system for determining at least one power source currently providing power to a load, wherein the load can be connected to a plurality of power sources.

Also, disclosed herein is a method and system for characterizing at least one load currently connected to at least one power supply.

Figure 2:
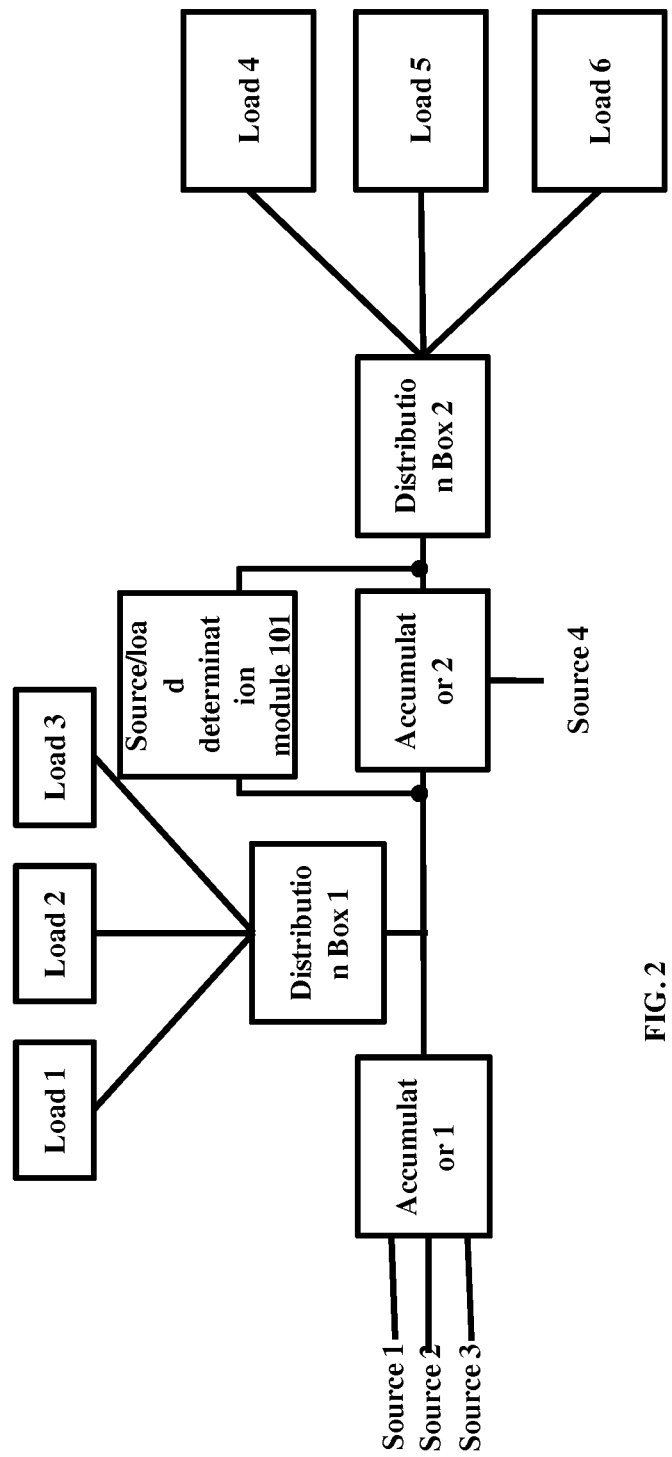
FIG. 2 depicts the system for determining the power source and characterizing the load(s), according to embodiments as disclosed herein.

FIG. 2 depicts a system for determining the power source and characterizing the loads, according to embodiments as disclosed herein. The system can be connected to an electrical network comprising of at least one power source and at least one load. The system can comprise of a plurality of accumulators (as an example, consider that there are two accumulators in the system). The load can be connected to a plurality of power sources, wherein one or more of the power sources supplies power to the load(s). The power sources can be of disparate types. The power sources can comprise of one or more power sources of the same type. The accumulators can accumulate the power from the source(s) currently supplying power to the load and provide the accumulated power to the load. The system can comprise of other components (such as an AC to DC power Converter), which can be necessary for the load to utilize the power source. The load(s) can comprise of at least one load connected to the system. Examples of the load(s) are air conditioners, cooling/ventilation systems, computing systems, servers, network equipment, motors, pumps, and so on. Each load can be functional simultaneously or at a single time.

A source/load determination module 101 can be connected at a suitable location in the electrical network, such as before the accumulators, between the accumulators, after the accumulators and so on. The source/load determination module 101 can be connected in the electrical network after at least one power source has been accumulated. The source/load determination module 101 can be connected before at least one load has been connected to the system. The source/load determination module 101 can be connected in the electrical network before the final load has been connected to the system. In an embodiment herein, the source/load determination module 101 can also be connected after the accumulators. In an embodiments herein, the source/load determination module 101 can be connected at multiple points in the electrical network. The source/load determination module 101 can be connected in such a manner as to sample waveforms of the power supplies in the electrical network, at a single point after the power sources have been accumulated. The source/load determination module 101 can be connected in the electrical network, in such a manner as to sample waveforms of the power supplies before the load is connected at each or some of the connection points coming out of the accumulation point. The source/load determination module 101 can perform sampling at a single point or multiple points in the electrical network during, before or after accumulation.

The accumulators accumulates all the power sources and provides a single power supply according at a lowest possible cost per unit, based on a plurality of factors such as availability of power sources, cost factor, a pre-defined ordering of preferred power sources, the characteristics of the load, and so on. The distribution boxes divide the power according to the type and nature of the load (Air conditioner, tube light, base station, transmission racks, and so on).

The source/load determination module 101 can sample the waveform of the power supplies. The waveform can be of voltage, current, power or a combination of two or more of voltage, current and power waveforms. If the source/load determination module 101 is sampling the current waveform, the source/load determination module 101 can be connected in series. In an embodiment herein, the source/load determination module 101 need not have a physical connection to the circuit; the source/load determination module 101 can sample the waveform using a suitable means such as EMF (Electromotive Force) radiation/noise, induction, audio hum or ripples post AC-DC conversion and so on. The source/load determination module 101 can analyze the characteristics of the sampled waveform. In an embodiment herein, the source/load determination module 101 can analyze the characteristics of the sampled waveforms in time domain. In an embodiment herein, the source/load determination module 101 can analyze the characteristics of the sampled waveforms in frequency (spectral) domain. For example, the source/load determination module 101 can analyze the characteristics of the sampled waveforms using Fourier Transform. For example, the source/load determination module 101 can use at least one of the amplitude of the sampled waveforms at the base frequency or the base frequency itself to identify the power source. In another example, the source/load determination module 101 can use harmonics of the sampled waveforms to identify the power source. Based on a label assigned to each of the power source, the source/load determination module 101 can provide the identity of the power source in the form of the label. The label can be provided by an operator and/or an authorized person and is a means for the operator and/or an authorized person to identify the power source. The source/load determination module 101 can also learn the label, based on previous instances. The label can comprise of a description of the power source. The label can be based on a plurality of factors such as analysis of waveform data, site characteristics (such as energy bills and so on). The operator and/or an authorized person can view the power source, based on the label. The source/load determination module 101 can also provide further information such as the runtime of the power source, the power levels, DG loading ratio, CPH (Diesel Consumption Per Hour), and so on.

In an embodiment herein, the source/load determination module 101 can characterize the load(s) and presence of specific load(s) (such as air conditioning and so on), based on the analysis. The loads can be determined based on the analysis of the waveforms. The source/load determination module 101 can assign at least one label based on the load(s). Based on a label assigned to the load(s), the source/load determination module 101 provides the identity of the load(s) in the form of the label. The label can be provided by an operator and/or an authorized person and is a means for the operator and/or an authorized person to identify the load(s). The label can comprise of a description of the load. The label can be based on a plurality of factors such as analysis of waveform data, site characteristics (such as energy bills and so on), load characteristics, power consumption of the load and so on. The source/load determination module 101 can also provide further information such as the runtime of the load(s), the power levels, state of operation of the load(s), and so on. There can be labels indicating presence and characteristics of the load(s). The scenario for loads is very similar to source as typically sensing is done just before load post distribution of AC/DC power, while embodiments herein perform sensing prior to that.

The source/load determination module 101 can sample the waveforms, wherein the waveforms can be influenced by the presence and activities of the loads (for example, amplitude, fundamental frequency and the harmonics of the voltage waveform can be influenced by switching on/off certain loads). The waveform can be of voltage, current, power or a combination of two or more of voltage, current and power waveforms. If the source/load determination module 101 is sampling the current waveform, the source/load determination module 101 can be connected in series. In an embodiment herein, the source/load determination module 101 need not have a physical connection to the circuit; the source/load determination module 101 can sample the waveform using a suitable means such as EMF (Electromotive Force) radiation/noise, induction, audio hum or ripples post AC-DC conversion and so on. The source/load determination module 101 can analyze the characteristics of the sampled waveform. In an embodiment herein, the source/load determination module 101 can analyze the characteristics of the sampled waveforms in time domain. In an embodiment herein, the source/load determination module 101 can analyze the characteristics of the sample waveforms in frequency (spectral) domain. For example, the source/load determination module 101 can use the amplitude of the sampled waveforms at the base frequency to identify the load(s) and determine at least one characteristic of the load(s). In another example, the source/load determination module 101 can use harmonics in the sampled waveforms to identify the load(s) and determine at least one characteristic of the load(s). Examples of the characteristics can comprise of the power drawn by the load(s) (in terms of voltage and/or current), the duration that the load(s) have been drawing power, operating mode of the load(s), and so on. Based on a label assigned to each of the load, the source/load determination module 101 can provide the identity or state of operation of the load in the form of the label. The label can be provided by an operator and/or an authorized person and is a means for the operator and/or an authorized person to identify the load. The source/load determination module 101 can also learn the label, based on previous instances. The label can comprise of a description of the load. The label can be based on a plurality of factors such as analysis of waveform data, site characteristics (such as energy bills and so on), load characteristics, type of load, time that the load has been operating, and so on. The operator and/or an authorized person can view the load(s), based on the label. The source/load determination module 101 can also provide further information such as the runtime of the load, the power levels consumed by the loads (both current and historical), and so on.

In an embodiment herein, the source/load determination module 101 can identify changes in the load(s) (which can be abrupt changes or gradual changes). The source/load determination module 101 can obtain insights from the changes in the load(s), such as a change in equipment/tenancy addition/equipment failure, indications about a failure in the future, and so on. The source/load determination module 101 can provide an alert to the operator about the changes in the load(s) and/or related information.

In an embodiment herein, the source/load determination module 101 can determine source and load characteristics using a suitable means such as phase difference in the sampled voltage & current waveforms.

In an embodiment herein, the source/load determination module 101 can enable calculation of runtime for each of the power sources, based on the determined power sources and the load characteristics.

The source/load determination module 101 can be trained (machine learning) to enable the source/load determination module 101 to identify the power source based on the analysis and the corresponding labels to be applied.

The source/load determination module 101 can monitor the health of the power sources. The source/load determination module 101 can identify backup/health related data for each battery. In an example herein, consider that one of the power sources is a battery, the source/load determination module 101 can check the health of the battery (in terms of factors such as backup time provided by the battery, health of the battery and other factors). The source/load determination module 101 can further determine if replacement and/or maintenance of the battery is required, replacement and/or maintenance of one or more cells within the battery, preventive & predictive maintenance of the battery and so on. The source/load determination module 101 can be configured to provide an alert using a suitable means such as an audio signal, a visual indication and so on. The source/load determination module 101 can further provide alerts in the form of at least one of SMS (Short Messaging Service), an email and so on.

The source/load determination module 101 can provide alerts, on detecting that the voltage provided by the power supply(ies) to the load has gone above or below pre-defined thresholds. The thresholds can depend on the load and be configured and/or modified by an authorized person. The source/load determination module 101 can be configured to provide an alert using a suitable means such as an audio signal, a visual indication and so on. The source/load determination module 101 can further provide alerts in the form of at least one of SMS, an email and so on.

The source/load determination module 101 can monitor the quality of the power supply(ies) in terms of voltage and/or frequency). The source/load determination module 101 can further determine supply quality for each phase of the power supply(ies), in case of multi-phase power supply(ies).

The source/load determination module 101 can detect boost charging or other maintenance activities carried out at site of the load(s). The source/load determination module 101 can further report boost charging or other maintenance activities carried out at site of the load(s) in the form of alerts (which can be in the form of at least one of audio alerts, visual alerts, SMSs, emails and so on).

The source/load determination module 101 can calculate loading ratio & diesel consumption per hour of the diesel generator (when the diesel generator is a power source) based on spectral characteristics.

The source/load determination module 101 can detect rectifier failure(s) based on a plurality of factors such as battery charging rate and so on. The source/load determination module 101 can be configured for suggesting rectifier upgrades incase of inadequate capacity or any other reason. The source/load determination module 101 can be configured to provide the suggestions in the form of alerts using a suitable means such as an audio signal, a visual indication and so on. The source/load determination module 101 can further provide alerts in the form of at least one of SMS, an email and so on.

Figure 3:
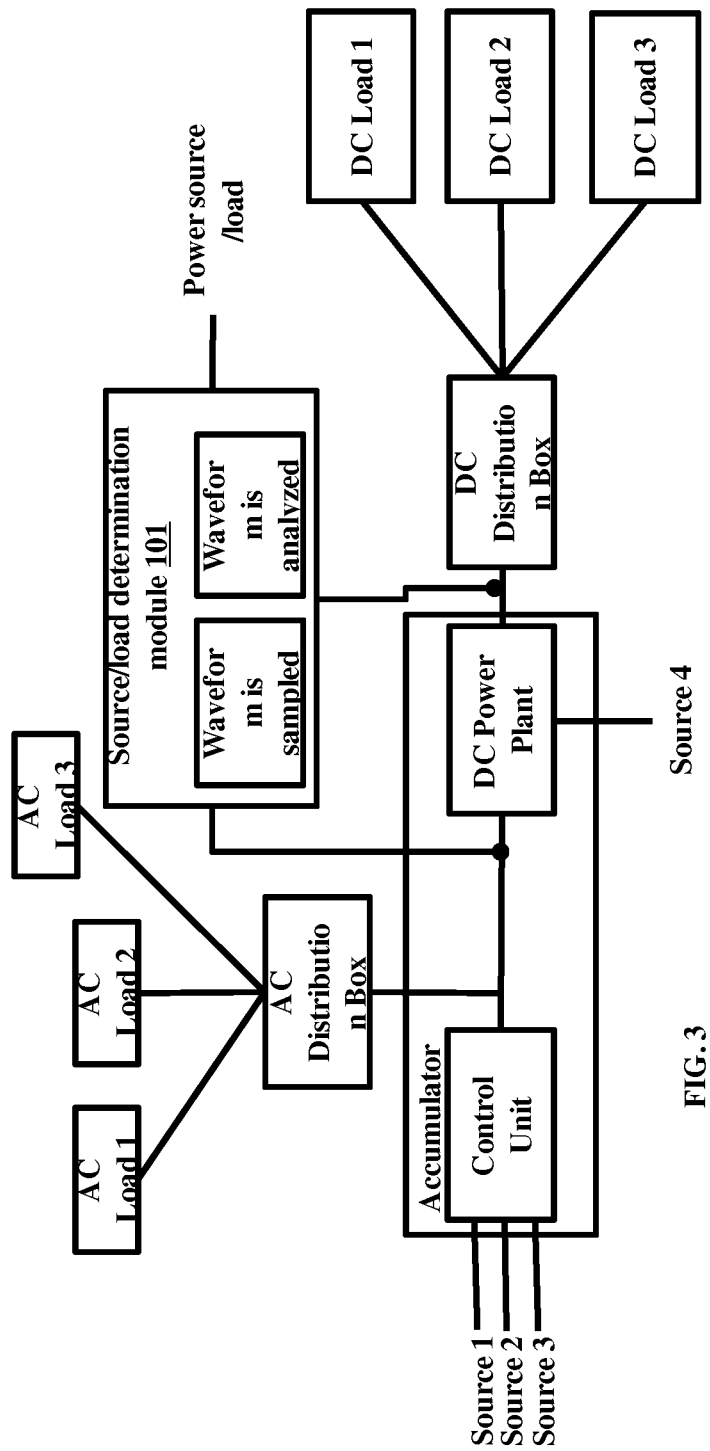
FIG. 3 depicts the process for determining the power source and characterizing the load(s), according to embodiments as disclosed herein.
Figure 4:
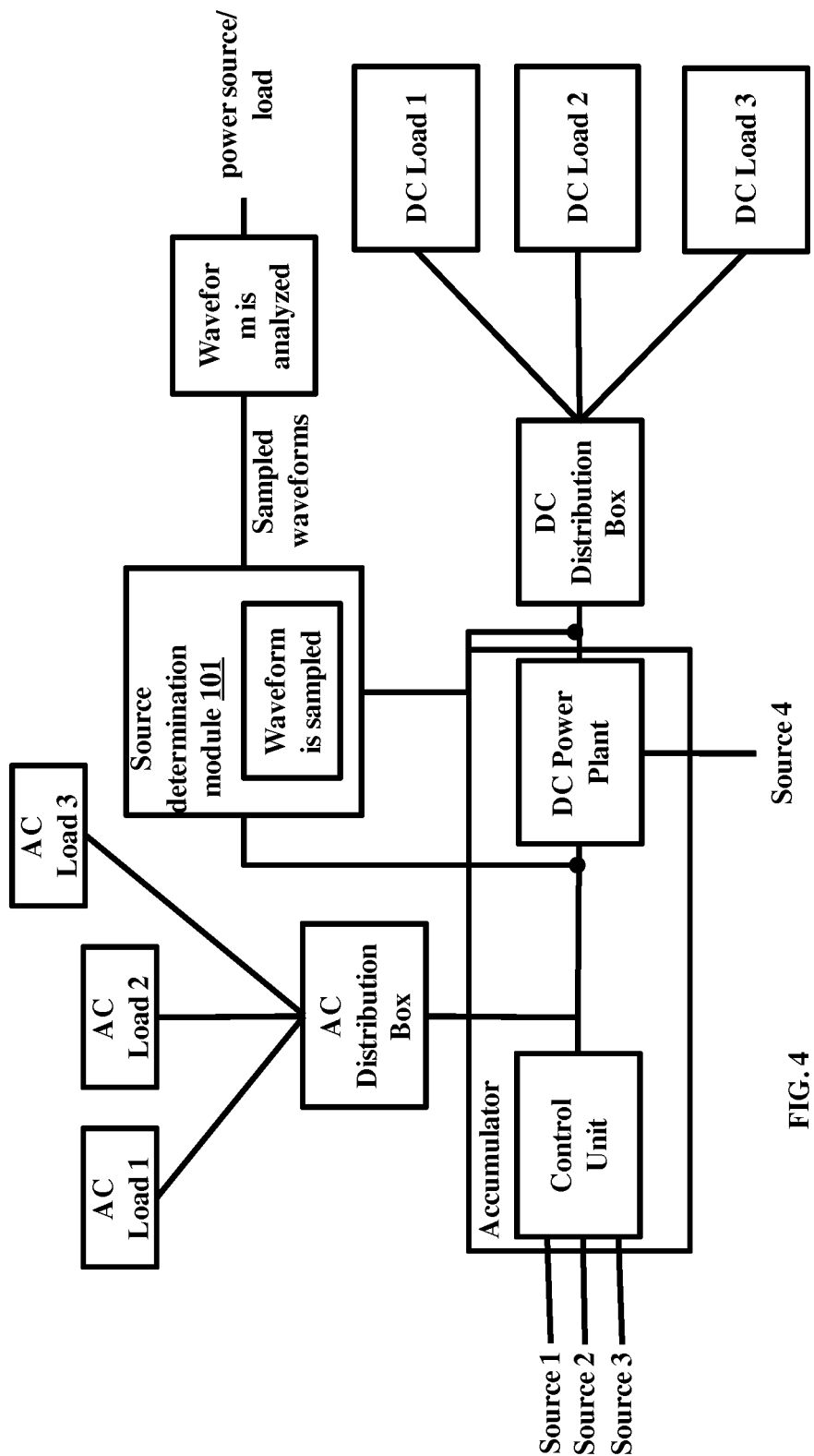
FIG. 4 depicts the process for determining the power source and characterizing the load(s), according to embodiments as disclosed herein.

In an embodiment herein, the above-disclosed steps can be performed completely or partially by another module, separate from the source/load determination module 101 (as depicted in FIGS. 3 and 4). This other module can be connected to the source/load determination module 101 using a suitable means such as a wired means, wireless means and so on.

In an embodiment herein, the source/load determination module 101 can analyze the waveforms using at least one suitable analog circuit (such as filter(s), modulator(s), comparator(s), and so on) performing analog domain analysis, before assigning at least one label. In another embodiment herein, the source/load determination module 101 can use a combination of analog domain analysis, followed by sampling and digital analysis.

Figure 5:
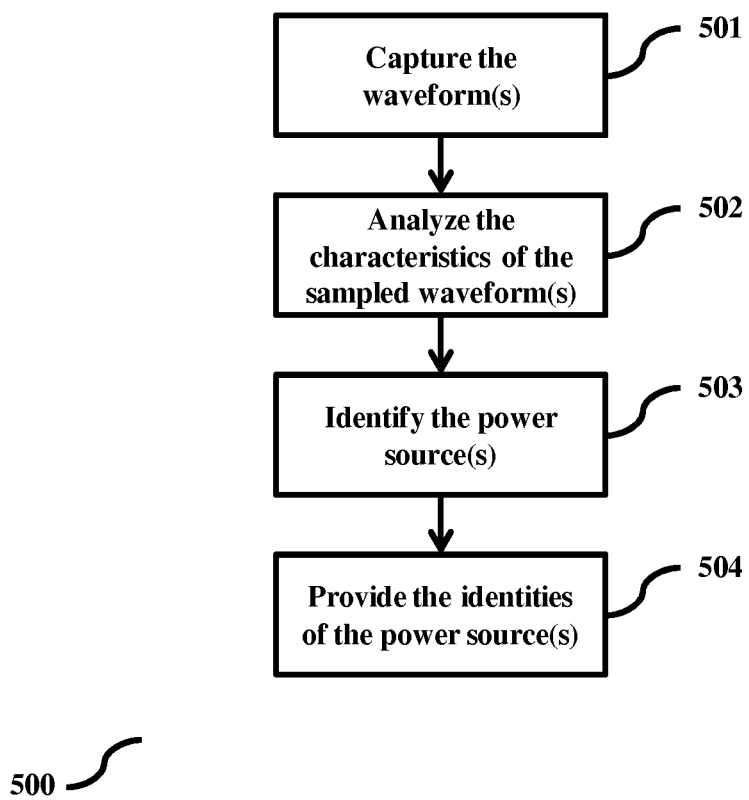
FIG. 5 is a flowchart depicting the process of determining the power supply supplying power to a load, according to embodiments as disclosed herein.

FIG. 5 is a flowchart depicting the process of determining the power supply supplying power to a load, according to embodiments as disclosed herein. The source/load determination module 101 captures (501) the waveform(s). The source/load determination module 101 can capture the waveforms using at least one of digital means (such as sampling the waveform(s)), analog means (such as analog circuitry) or a combination of analog and digital means. The source/load determination module 101 analyzes (502) the characteristics of the sampled waveform(s) in at least one of time domain or frequency (spectral) domain. Based on the analysis of the characteristics of the sampled waveform(s), the source/load determination module 101 identifies (503) the power source(s). For example, the source/load determination module 101 can use the amplitude of the sampled waveforms at the base frequency to identify the power source(s). In another example, the source/load determination module 101 can use harmonics of the sampled waveforms to identify the power source(s). The source/load determination module 101 provides (504) the identities of the power source(s) in the form of the label(s) assigned to each of the power sources. The label can comprise of a description of the power source. The label can be based on a plurality of factors such as analysis of waveform data, site characteristics (such as energy bills and so on). The various actions in method 500 may be performed in the order presented, in a different order or simultaneously. Further, in some embodiments, some actions listed in FIG. 5 may be omitted.

Figure 6:
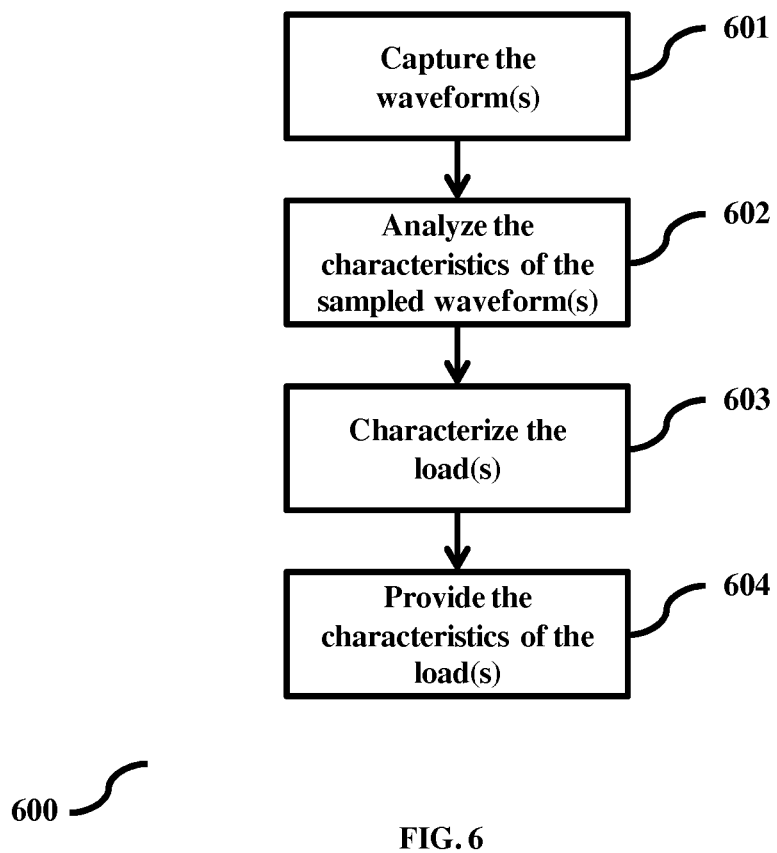
FIG. 6 is a flowchart depicting the process of characterizing the load(s), according to embodiments as disclosed herein.

FIG. 6 is a flowchart depicting the process of characterizing the load(s), according to embodiments as disclosed herein. The source/load determination module 101 captures (601) the waveform(s). The source/load determination module 101 can capture the waveforms using at least one of digital means (such as sampling the waveform(s)), analog means (such as analog circuitry) or a combination of analog and digital means. The source/load determination module 101 analyzes (602) the characteristics of the sampled waveform(s) in at least one of time domain or frequency (spectral) domain. Based on the analysis of the characteristics of the sampled waveform(s), the source/load determination module 101 characterizes (603) the load(s). For example, the source/load determination module 101 can use the amplitude of the sampled waveforms at the base frequency to characterize the load(s). In another example, the source/load determination module 101 can use harmonics of the sampled waveforms to characterize the load(s). The source/load determination module 101 provides (504) the characteristics of the load(s) in the form of the label(s) assigned to the load(s). The label can comprise of a description of the load. The label can be based on a plurality of factors such as analysis of waveform data, site characteristics (such as energy bills and so on). The various actions in method 600 may be performed in the order presented, in a different order or simultaneously. Further, in some embodiments, some actions listed in FIG. 6 may be omitted.

Figure 7:
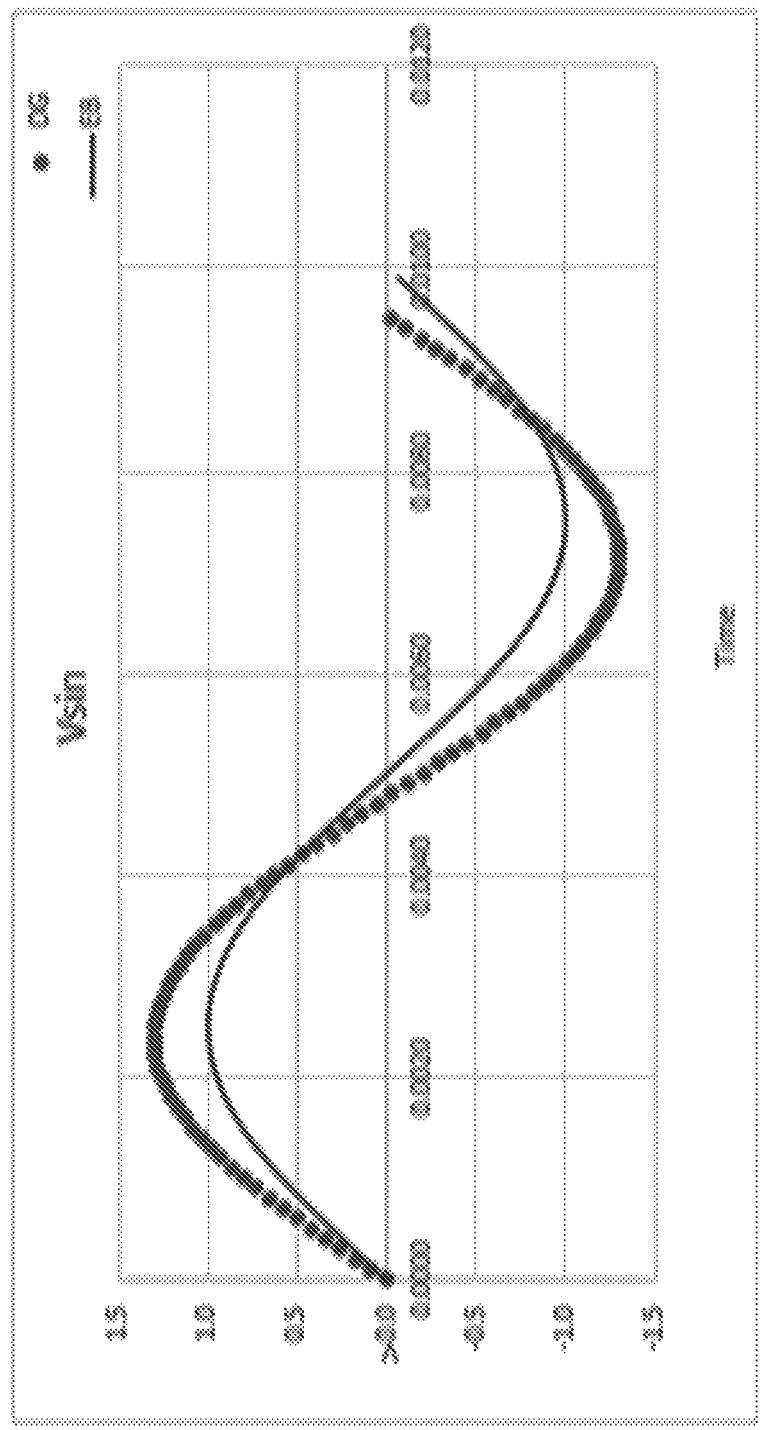
FIG. 7 depicts sample waveforms, which can be used to determine the power source, according to embodiments as disclosed herein.

FIG. 7 depicts sample waveforms which can be used to determine the power source. In the example provided herein, for a particular site, the frequency of the signal provided by the diesel generator (the fundamental frequency) can be seen to be greater than the frequency of grid supply (as depicted in the figure). Hence, the source/load determination module 101 can determine that a signal with the higher frequency can belong to the diesel generator, wherein the source/load determination module 101 can be trained to determine that the frequency within a higher range can belong to the diesel generator and not to the EB.

Figure 8A:
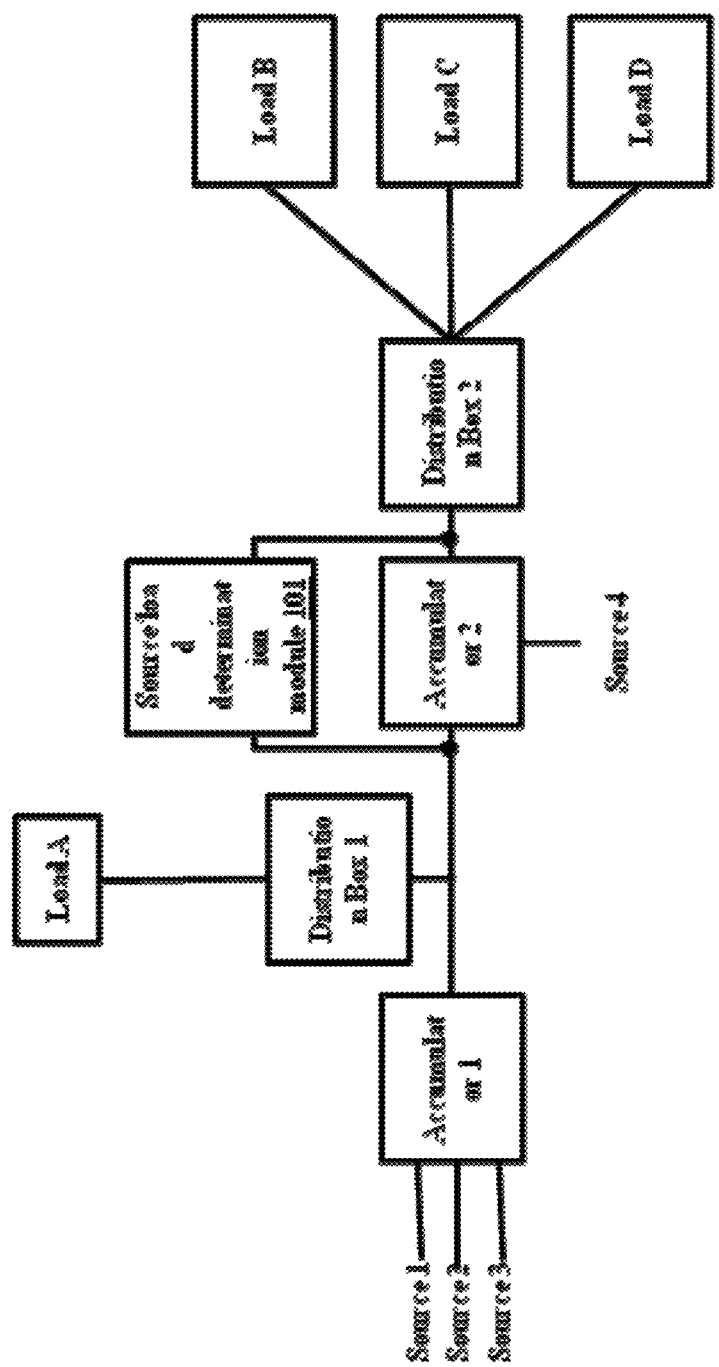
FIGS. 8a and 8b are example block diagrams and graphs respectively, which depict the process of characterizing a load, according to embodiments as disclosed herein.
Figure 8B:
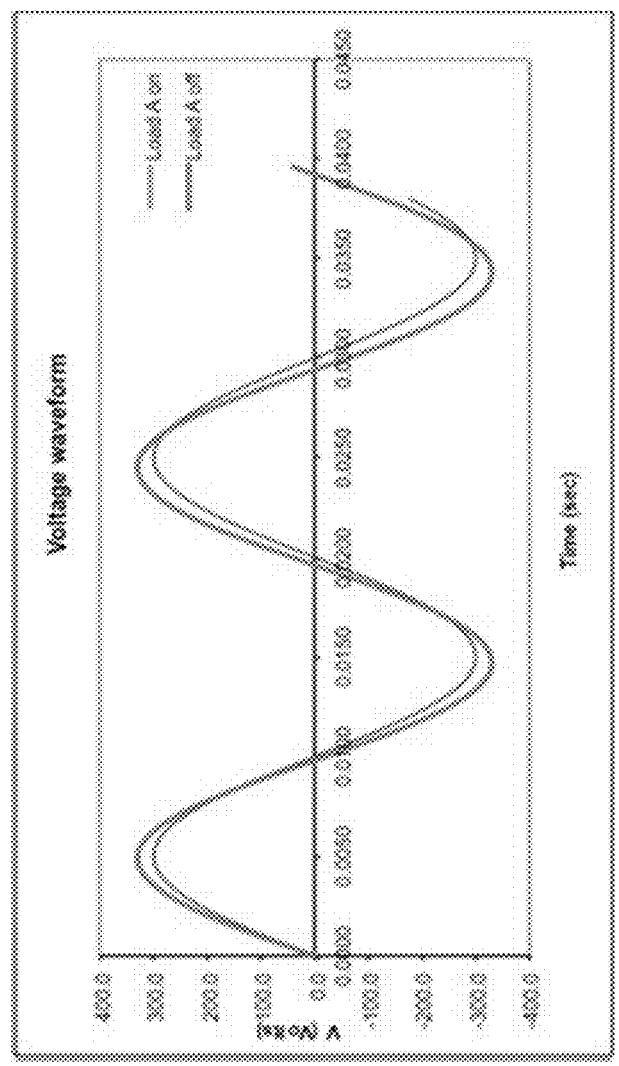

FIGS. 8*a* and 8*b* are example block diagrams and graphs respectively, which depict the process of characterizing a load. Consider that loads A, B, C and D are connected to the power supply (as depicted in FIG. 8*a*). Currently, consider that only load A is turned ON and is drawing power from the power supply. FIG. 8*b* depicts the example waveforms, for when load A is turned ON and OFF. Based on the changes in the waveforms (in terms of at least one of amplitude, frequency, harmonics, and so on), the source/load determination module 101 can determine the state of operation of load A. A similar process can be followed for the characterization of one or more of the other loads.

The above figure is an example and does not limit the embodiments herein in any manner The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A method for determining at least one power source currently supplying power to at least one load and characterizing said load, said method comprising:
   performing analysis on waveform of at least one signal from said at least one power source by a source/load determination module, wherein a plurality of power sources are connected to said load;
   accumulating at least one signal from said at least one power source currently supplying power to said at least one load by at least one accumulator;
   analyzing said at least one accumulated signal by said source/load determination module;
   determining said at least one power source, currently supplying power to said at least one load by said source/load determination module, on said source/load determination module analyzing said at least one sampled accumulated signal; and
   characterizing said at least one load by said source/load determination module, on said source/load determination module analyzing said at least one sampled accumulated signal.

2. The method, as claimed in claim 1, wherein said method further comprises of at least one of
   sampling said at least one accumulated signal at one point; and
   sampling said at least one accumulated signal at a plurality of points.

3. The method, as claimed in claim 1, wherein analyzing said at least one accumulated signal further comprises of at least one of
   analysing said at least one accumulated signal by
      sampling said at least one accumulated signal; and
      performing at least one of time domain analysis; and frequency domain analysis of said at least one accumulated signal; and
   analysing said at least one accumulated signal in analog domain.

4. The method, as claimed in claim 1, wherein said method further comprises of said source/load determination module adding at least one label to an output, wherein said output comprises of said at least one determined power source and said at least one characterized load.

5. The method, as claimed in claim 1, wherein said method further comprises of said source/load determination module calculating runtime, based on said at least one determined power source and said at least one load.

6. The method, as claimed in claim 1, wherein said method further comprises of said source/load determination module determining health of said at least one determined power source.

7. The method, as claimed in claim 1, wherein said method further comprises of said source/load determination module providing at least one alert, based on at least one of voltage, current, or power supplied by said at least one determined power source to said at least one load.

8. The method, as claimed in claim 1, wherein said method further comprises of said source/load determination module determining quality of said at least one determined power source.

9. The method, as claimed in claim 1, wherein said method further comprises of said source/load determination module calculating loading ratio of a diesel generator, on said at least one determined power source being at least said diesel generator.

10. The method, as claimed in claim 9, wherein said method further comprises of said source/load determination module calculating CPH (Consumption Per Hour) of said diesel generator, on said at least one determined power source being at least said diesel generator.

11. The method, as claimed in claim 1, wherein said method further comprises of said source/load determination module detecting rectifier failure.

12. A system for determining at least one power source currently supplying power to at least one load and characterizing said load, said system comprising:
   a source/load determination module configured to perform analysis on waveform of at least one signal from said at least one power source, wherein a plurality of power sources are connected to said load;
   at least one accumulator configured to accumulate at least one signal from said at least one power source currently supplying power to said at least one load;
   said source/load determination module configured to analyze said at least one accumulated signal;
   determine said at least one power source currently supplying power to said at least one load, on analyzing said at least one sampled accumulated signal; and
   characterize said at least one load, on said source/load determination module analyzing said at least one sampled accumulated signal.

13. The system, as claimed in claim 12, wherein said system is further configured for performing at least one of
   sampling said at least one accumulated signal at one point; and
   sampling said at least one accumulated signal at a plurality of points.

14. The system, as claimed in claim 12, wherein said system is configured for analyzing said at least one accumulated signal by performing at least one of
   analysing said at least one accumulated signal by sampling said at least one accumulated signal; and
   performing at least one of time domain analysis; and frequency domain analysis of said at least one accumulated signal; and
   analysing said at least one accumulated signal in analog domain.

15. The system, as claimed in claim 12, wherein said system is further configured for adding at least one label to an output, wherein said output comprises of said at least one determined power source and said at least one characterized load.

16. The system, as claimed in claim 12, wherein said system is further configured for calculating runtime, based on said at least one determined power source and said at least one load.

17. The system, as claimed in claim 12, wherein said system is further configured for determining health of said at least one determined power source.

18. The system, as claimed in claim 12, wherein said system is further configured for providing at least one alert, based on at least one of voltage, current, or power supplied by said at least one determined power source to said at least one load.

19. The system, as claimed in claim 12, wherein said system is further configured for determining quality of said at least one determined power source.

20. The system, as claimed in claim 12, wherein said system is further configured for calculating loading ratio of a diesel generator, on said at least one determined power source being at least said diesel generator.

21. The system, as claimed in claim 20, wherein said system is further configured for calculating CPH (Consumption Per Hour) of said diesel generator, on said at least one determined power source being at least said diesel generator.

22. The system, as claimed in claim 12, wherein said system is further configured for detecting rectifier failure.

23. The method, as claimed in claim 1, wherein said method further comprises of said source/load determination module detecting maintenance activities carried out at site of said at least one load.

24. The system, as claimed in claim 12, wherein said source/load determination module is further configured for detecting maintenance activities carried out at site of said at least one load.

* * * * *